United States Patent [19]
Brown

[11] Patent Number: 6,072,738
[45] Date of Patent: Jun. 6, 2000

[54] CYCLE TIME REDUCTION USING AN EARLY PRECHARGE

[75] Inventor: Jeff S. Brown, Fort Collins, Colo.

[73] Assignee: LSI Logic Corporation, Milpitas, Calif.

[21] Appl. No.: 09/036,951

[22] Filed: Mar. 9, 1998

[51] Int. Cl.[7] .................................................. G11C 7/00
[52] U.S. Cl. .......................... 365/203; 365/190; 365/207; 365/208; 365/233
[58] Field of Search .................................. 365/203, 190, 365/205, 207, 208, 202, 233

[56] References Cited

U.S. PATENT DOCUMENTS

| | | | |
|---|---|---|---|
| 4,355,377 | 10/1982 | Sud et al. ................................. | 365/203 |
| 4,558,435 | 12/1985 | Hsieh ...................................... | 365/203 |
| 4,638,462 | 1/1987 | Rajeevakumar et al. ............... | 365/203 |
| 4,701,889 | 10/1987 | Ando ...................................... | 365/203 |
| 4,712,197 | 12/1987 | Sood ...................................... | 365/190 |
| 5,297,091 | 3/1994 | Blake et al. ............................ | 365/203 |
| 5,313,434 | 5/1994 | Abe ...................................... | 365/233.5 |
| 5,355,343 | 10/1994 | Shu et al. ................................. | 365/203 |
| 5,392,249 | 2/1995 | Kan ........................................ | 365/203 |
| 5,479,374 | 12/1995 | Kobayashi et al. ................... | 365/233.5 |
| 5,487,043 | 1/1996 | Furutani et al. ......................... | 365/203 |
| 5,495,449 | 2/1996 | Park ........................................ | 365/203 |
| 5,592,426 | 1/1997 | Jallice et al. ............................ | 365/203 |
| 5,600,601 | 2/1997 | Murakami et al. ..................... | 365/203 |
| 5,619,464 | 4/1997 | Tran ....................................... | 365/203 |
| 5,745,421 | 4/1998 | Pham et al. ............................. | 365/203 |
| 5,828,612 | 10/1998 | Yu et al. ................................. | 365/203 |
| 5,828,614 | 10/1998 | Gradinariu ............................. | 365/208 |

*Primary Examiner*—Andrew Q. Tran

[57] ABSTRACT

A circuit in a memory device for precharging at least one bit line before a data read operation of the memory device is complete. The circuit includes a sense amplifier having at least one input and at least one output. The bit line is connected to the input of the sense amplifier via column decode logic, and a precharge circuit is connected to the bit line. An input keeper is connected to the sense amplifier inputs and is in communication with the precharge circuit and column decode logic. The input keeper holds a content of the bit line at the sense amplifier inputs and causes the precharge circuit to precharge the bit line as the content of the bit line propagates to the output of the sense amplifier.

19 Claims, 1 Drawing Sheet

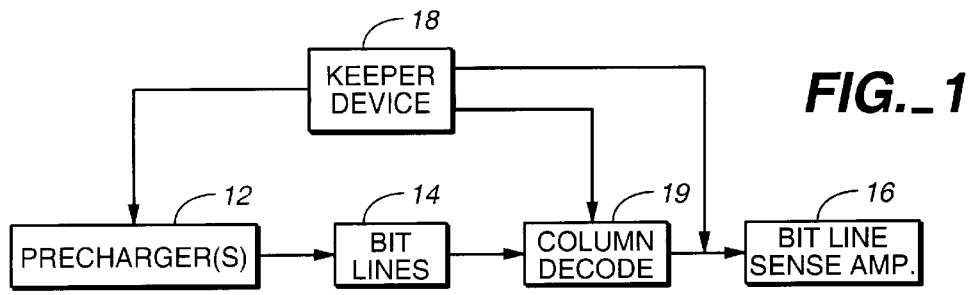
FIG._1
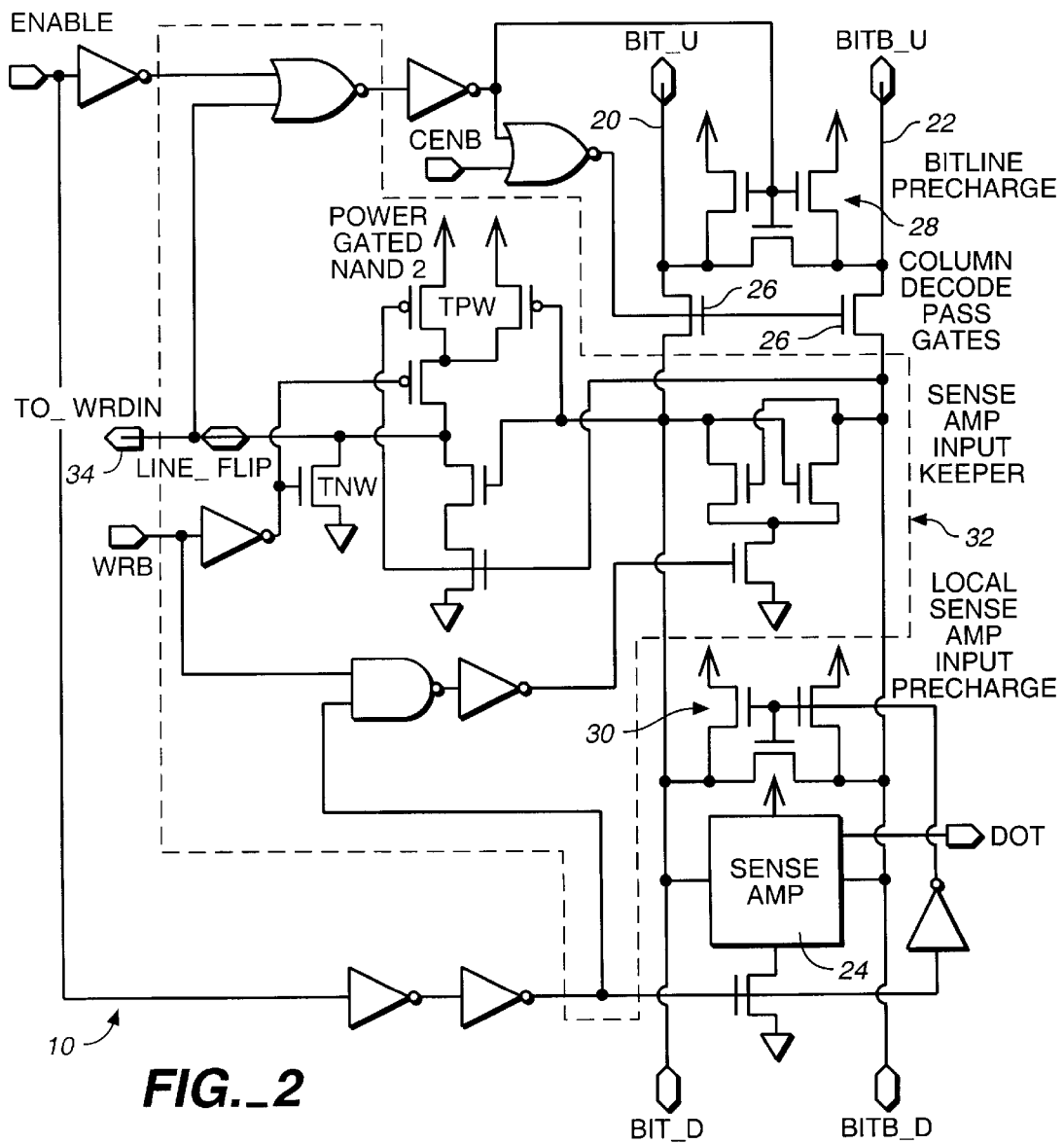
FIG._2

CYCLE TIME REDUCTION USING AN EARLY PRECHARGE

The present invention relates generally to circuits in memory devices for precharging bit lines, and more specifically relates to a circuit in a memory device for precharging bit lines before a data read operation is complete.

BACKGROUND OF THE INVENTION

A typical semiconductor memory device includes a plurality of memory cells or bitcells arranged in arrays, and a memory cell selector means for enabling the selection of a particular memory cell to facilitate the reading of data from, or the writing of data to, that particular memory cell.

For example, a high density dynamic random access memory (DRAM) includes a plurality of core cell blocks, and each core cell block contains several memory cells. The memory cells are metal-oxide semiconductor field-effect transistors (MOSFETs), and each MOSFET acts as a switch. To this end, each pair of MOSFETs is connected to a pair of bit lines (an input/output or I/O port), and the capacitance of each MOSFET can be charged by data. While one of the bit lines is the data itself, the other bit line is the complement data.

A bit line sense amplifier is provided in communication with a pair of bit lines corresponding to a set of memory cells. Each bit line sense amplifier amplifies the data which is read from the corresponding memory cell through the bit line pair or I/O port.

Before a typical read or write cycle, both bit lines of a memory cell are precharged. Then, during the data read or data write, the bit lines pass through a column decode (pass gates) and are routed to the bit line sense amplifier. When the inputs to the bit line sense amplifier trip, the data is known. After the inputs propagate through the bit line sense amplifier to the data output latch, the data read is complete, and the bit lines are again precharged to initiate the next data read or data write. As a result of waiting to again precharge the bit lines until the inputs have propagated through the bit line sense amplifier to the data output, the time to start the next memory operation (read or write) is not minimized.

OBJECTS AND SUMMARY

It is an object of the present invention to reduce the time between data reads in a memory device.

It is a further object of the present invention to reduce the time it takes to write data in a memory device after a data read.

It is a further object of the present invention to precharge bit lines in a memory device before a data read operation of the memory device is complete.

In accordance with these and other objects, the present invention provides a circuit in a memory device for precharging at least one bit line before a data read operation of the memory device is complete. The circuit includes a sensor having at least one input and at least one output. Preferably, the input of the sensor is connected to a bit line pair via column decode logic. The bit line is connected to the column decode, and a precharger is connected to the bit line. A keeper device is connected to the sensor input and is in communication with the precharger. The keeper device holds a content of the sensor input and causes the precharger to precharge the bit line as the content of the bit line propagates to the output of the sensor.

Preferably, the memory device is a dynamic random access memory device and the sensor is a bit line sense amplifier. Desirably, a column decode pass gate is connected to the bit line, and the keeper device is in communication with the column decode pass gate. The keeper device disables the column decode pass gate as the content of the bit line propagates through the bit line sense amplifier. Preferably the keeper device is also in communication with a wordline driver and disables the wordline driver as the content of the bit line propagates through the sensor.

Another aspect of the present invention provides a method of precharging at least one bit line in a memory device before a data read operation of the memory device is complete. The method includes providing a sensor having at least one input and at least one output, where the bit line is preferably connected to the input of the sensor via column decode logic, and providing a precharger connected to the bit line. The content of the bit line is held at the input of the sensor and the precharger is directed to precharge the bit line as the content of the bit line propagates through the sensor to said output.

Preferably, the memory device is a dynamic random access memory device, and the sensor is a bit line sense amplifier. Preferably, the method includes providing a keeper device connected to the inputs of the bit line sense amplifier and in communication with the precharger, and includes providing a column decode pass gate connected to the bit line. The keeper device is in communication with the column decode pass gate and at least one wordline driver, and the keeper device disables the column decode pass gate and wordline driver as the content of the bit line propagates through the bit line sense amplifier.

By providing that bit lines are precharged before a data read operation is complete, the time between data reads and the time it takes to write data after a data read is reduced.

BRIEF DESCRIPTION OF THE DRAWINGS

The present invention and the advantages thereof will become more apparent upon consideration of the following detailed description when taken in conjunction with the accompanying drawings of which:

FIG. 1 is a block diagram illustrating the general concept of an embodiment of the present invention; and FIG. 2 is a schematic diagram of a circuit in a memory device in accordance with an embodiment of the present invention.

DETAILED DESCRIPTION OF AN EMBODIMENT OF THE INVENTION

FIG. 1 is a block diagram illustrating the general concept of an embodiment of the present invention. FIG. 2 is somewhat more specific and schematically illustrates a circuit 10 in a memory device in accordance with the embodiment of the present invention.

As shown in FIG. 1, an embodiment of the present invention provides one or more bit line prechargers 12 connected to bit lines 14. The bit lines 14 preferably consist of a pair of bit lines where one bit line is the data itself, and the other bit line is the complement data. The bit lines 14 are connected to a bit line sense amplifier 16 or some other type of sensor through a column decode block 19 and are in communication with a memory cell or bitcell (not shown). During a data read, the memory cell drives the bit lines 14, the column decode logic 19 connects the bit lines 14 to the bit line sense amplifier 16 inputs, and the bit line sense amplifier 16 compares the charge level of the bit lines and senses which bit line has the higher charge. The one or more prechargers 12 precharge the bit lines 14 to prepare the bit lines 14 for a subsequent data read or data write operation. The one or more prechargers 12 connected to the bit lines 14 may consist of one or more voltage divider circuits.

A keeper device 18 is connected to the inputs into the bit line sense amplifier 16 and is in communication with the one or more bit line prechargers 12 and the column decode block 19. When the inputs to the bit line sense amplifier 16 transition, the keeper device 18 will hold them and the transition information is fed back to the bit line prechargers 12 to start an early precharge—a precharge of the bit lines 14 before a data read operation is complete. The transition information is also used to disable the column decode block 19 so that the bit lines 14 are no longer in communication with the bit line sense amplifier 16.

As a result of providing that the bit lines 14 are precharged before a data read operation is complete, the time between data reads and the time it takes to write data after a data read is reduced.

As mentioned, FIG. 2 schematically illustrates a circuit 10 in a memory device in accordance with an embodiment of the present invention. That which is illustrated in FIG. 2 will now be described. Preferably, the circuit 10 shown in FIG. 1 is employed in a synchronous memory device such as in a dynamic random access memory (DRAM) device. The circuit 10 includes a pair of bit lines 20 and 22 where one bit line 20 is data itself of a memory cell, and the other bit line 22 is the complement data. Connected to the bit lines 20 and 22 is a bit line sense amplifier 24 or other type of sensor. Also connected to the bit lines 20 and 22 are the pass gates 26 of a column decoder and one or more bit line prechargers 28. A local precharger 30 is connected to the inputs into the bit line sense amplifier 24. Also connected to the inputs of the bit line sense amplifier 24 is a keeper device 32, and the keeper device 32 is in communication with the one or more bit line prechargers 28. The keeper device 32 is also in communication with the pass gates 26 and with one or more wordline drivers 34.

Before a data read operation, the bit lines 20 and 22 are precharged by the one or more bit line prechargers 28 and then the memory cell drives the bit lines 20 and 22. Typically, while one of the bit lines remains stable, the other bit line is pulled down by the memory cell. The keeper device 32 helps pull the falling bit line down and holds it there. Much like as was described with regard to FIG. 1, the circuit 10 shown in FIG. 2 provides that when the inputs to the bit line sense amplifier 24 transition, the keeper device 32 will hold them and feed the transition information back to the bit line prechargers 28 in order to start an early precharge—a precharge of the bit lines 20 and 22 before a data read operation is complete. The keeper device 32 also feeds back the transition information to disable the column decode pass gates 26 and wordline driver 34 as the content of the bit lines 20 and 22 propagates through the bit line sense amplifier 24.

The specific structure of the keeper device 32 and the manner in which the keeper device 32 operates within the circuit 10 will now be described. At the start of a read operation, "wrb" as shown in FIG. 2 is low, and the pass gates 26 are enabled after the "cenb" signal falls from a column address decode. The rising "Enable" signal, which starts the data read operation, disables the bit line prechargers 28. At this time, the high bit lines into the Power Gated Nand 2 ("PG nand 2") keep the "Line Flip" de-asserted. This essentially guarantees that the bit line prechargers 28 will be disabled.

The "Enable" signal will enable the bit line sense amplifier 24 as well as the keeper device 32. When the memory cell begins driving the bit lines 20 and 22 such that the one bit line begins to discharge or be pulled down, the keeper device 32 holds the bit line in the discharged state. Once the bit lines 20 and 22 transition, the "PG nand 2" output will rise (at this time, during a data read operation, "wrb" is high), and the "Line Flip" node will assert which enables the bit line prechargers 28 and disables the pass gates 26. The "Line Flip" signal also disables the one or more wordline drivers 34 connected thereto.

When the cycle completes with a falling "Enable" signal, the bit line prechargers 28 will remain enabled, the local prechargers 30 connected to the inputs of the bit line sense amplifier 24 are enabled, and the bit line sense amplifier 24 and keeper device 32 will be disabled. Once the local prechargers 30 precharge the inputs of the bit line sense amplifier 24, the "Line Flip" signal will de-assert.

When a data read operation is followed by a data write operation without de-asserting the "Enable" line, the "wrb" input will assert. This assertion of the "wrb" input disables the keeper device 32 and releases the bit lines 20 and 22 around the bit line sense amplifier 24 thereby providing that a data write of true or complement data is possible.

The pull-up side of the "PG nand 2" will also be disabled via the "tpw" transistor. Then, the "tnw" will pull the "Line Flip" node down to disable the bit line prechargers 28 and enable the column decode pass gates 26. As a result of the foregoing, the time it takes to write data to the same location is reduced.

By providing that bit lines 20 and 22 are precharged before a data read operation is complete, the time between data reads and the time it takes to write data after a data read is reduced. The time ($T_{out}$) it takes the inputs of the bit line sense amplifier 24 to propagate to the data output latch is time that is saved by precharging the bit lines 20 and 22 early. The delay ($T_{pre}$) from the de-assertion of the memory's "Enable" signal until the bit line prechargers are enabled is also time that is saved by precharging the bit lines 20 and 22 early. As a result, the keeper device 32 feeds the bit line transition information back to the column decoder pass gates 26 and the wordline drivers 34 and causes the bit line prechargers 28 to initiate a precharge after only three gate delays ($T_g$), and the memory cycle time is reduced by as much as $$T_{out}+T_{pre}-T_g.$$

While a preferred embodiment of the present invention is shown and described, it is envisioned that those skilled in the art may devise various modifications of the present invention without departing from the spirit and scope of the appended claims.

What is claimed is:

1. A circuit in a memory device for precharging at least one bit line before a data read operation of the memory device is complete, said circuit comprising:
   a sense amplifier having at least one input and at least one output, said bit line connected to said input of said sense amplifier;
   a precharge circuit connected to said bit line; and
   an input keeper connected to said sense amplifier input and connected to said precharge circuit, said input keeper holding a voltage of said bit line at said sense amplifier input and directing said precharge circuit to precharge said bit line as said voltage of said bit line propagates through said sense amplifier to said output.

2. The circuit of claim 1, wherein said memory device comprises a dynamic random access memory.

3. The circuit of claim 1, wherein said sense amplifier comprises a bit line sense amplifier.

4. The circuit of claim 1, further comprising a column decode pass gate connected between said bit line and said sense amplifier, wherein said input keeper is in communication with said column decode pass gate.

5. The circuit of claim 4, wherein said input keeper disables said column decode pass gate as said voltage of said bit line propagates through said sense amplifier to said output.

6. The circuit of claim 1, further comprising at least one wordline driver, wherein said input keeper is connected to said wordline driver, and wherein said input keeper disables said wordline driver as said voltage of said bit line propagates through said sense amplifier to said output.

7. The circuit of claim 1, further comprising a column decode pass gate and at least one wordline driver, wherein said input keeper is connected to said column decode pass gate and said wordline driver, and wherein said input keeper disables said column decode pass gate and said wordline driver as said voltage of said bit line propagates through said sense amplifier to said output.

8. A circuit in a dynamic random access memory device for precharging at least one bit line before a data read operation is complete, said circuit comprising:
   a bit line sense amplifier having at least one input and at least one output, said bit line connected to said input of said bit line sense amplifier;
   a precharge circuit connected to said bit line;
   a column decode pass gate connected between said bit line and said bit line sense amplifier;
   at least one wordline driver;
   an input keeper connected to said bit line sense amplifier input and said precharge circuit, said column decode pass gate and said wordline driver, said input keeper holding a voltage of said bit line at said bit line sense amplifier input and directing said precharge circuit to precharge said bit line as said voltage of said bit line propagates through said bit line sense amplifier to said output, said input keeper disabling said column decode pass gate and said wordline driver as said voltage of said bit line propagates through said bit line sense amplifier.

9. A method of precharging at least one bit line in a memory device before a data read operation of the memory device is complete, said method comprising:
   providing a sense amplifier having at least one input and at least one output, said bit line connected to said input of said sense amplifier;
   providing a precharge circuit connected to said bit line;
   holding a voltage of said bit line at said sense amplifier input and directing said precharge circuit to precharge said bit line as said voltage of said bit line propagates through said sense amplifier to said output.

10. The method of claim 9, further comprising providing an input keeper connected to said sense amplifier input and said precharge circuit.

11. The method of claim 9, wherein said memory device comprises a dynamic random access memory.

12. The method of claim 9, wherein said sense amplifier comprises a bit line sense amplifier.

13. The method of claim 10, further comprising providing a column decode pass gate connected between said bit line and said sense amplifier, wherein said input keeper is in communication with said column decode pass gate.

14. The method of claim 13, further comprising disabling said column decode pass gate as said voltage of said bit line propagates through said sense amplifier.

15. The method of claim 9, further comprising providing at least one wordline driver and disabling said wordline driver as said voltage of said bit line propagates through said sense amplifier.

16. The method of claim 10, further comprising providing at least one wordline driver and disabling said wordline driver as said voltage of said bit line propagates through said sense amplifier.

17. The method of claim 16, wherein said input keeper is connected to said wordline driver, and wherein said input keeper disables said wordline driver as said voltage of said bit line propagates through said sense amplifier.

18. The method of claim 10, further comprising providing a column decode pass gate and at least one wordline driver, wherein said input keeper is connected to said column decode pass gate and said wordline driver, and wherein said input keeper disables said column decode pass gate and said wordline driver as said voltage of said bit line propagates through said sense amplifier.

19. A method of precharging at least one bit line in a dynamic random access memory device before a data read operation of the memory device is complete, said method comprising:
   providing a bit line sense amplifier having at least one input and at least one output, said bit line connected to said input of said bit line sense amplifier;
   providing a precharge circuit connected to said bit line;
   providing a column decode pass gate connected between said bit line and said bit line sense amplifier;
   providing at least one wordline driver;
   providing an input keeper connected to said bit line sense amplifier input and said precharge circuit, said column decode pass gate and said wordline driver, said input keeper holding a voltage of said bit line at said bit line sense amplifier input and directing said precharge circuit to precharge said bit line as said voltage of said bit line propagates through said bit line sense amplifier to said output, said input keeper disabling said column decode pass gate and said wordline driver as said voltage of said bit line propagates through said bit line sense amplifier.

* * * * *